(12) United States Patent
Kline et al.

(10) Patent No.: US 7,694,207 B1
(45) Date of Patent: Apr. 6, 2010

(54) METHOD OF DECODING SIGNALS HAVING BINARY BCH CODES

(75) Inventors: Jason Michael Kline, Odenton, MD (US); Donald W. Newhart, Elkridge, MD (US); Nicholas Paul Nirschl, Ellicott City, MD (US)

(73) Assignee: The United States of America as represented by the Director, National Security Agency, Washington, DC (US)

( * ) Notice: Subject to any disclaimer, the term of this patent is extended or adjusted under 35 U.S.C. 154(b) by 863 days.

(21) Appl. No.: 11/543,282

(22) Filed: Sep. 25, 2006

(51) Int. Cl.
*H03M 13/00* (2006.01)
(52) U.S. Cl. .................. 714/782; 714/781; 714/784
(58) Field of Classification Search .................. 714/781, 714/782, 784
See application file for complete search history.

(56) References Cited

U.S. PATENT DOCUMENTS

| | | | | |
|---|---|---|---|---|
| 4,030,067 | A * | 6/1977 | Howell et al. | 714/758 |
| 4,694,455 | A * | 9/1987 | Koga | 714/782 |
| 5,343,481 | A * | 8/1994 | Kraft | 714/782 |
| 5,430,739 | A * | 7/1995 | Wei et al. | 714/784 |
| 5,440,570 | A * | 8/1995 | Wei et al. | 714/782 |
| 6,615,387 | B1 * | 9/2003 | Williamson et al. | 714/785 |
| 6,971,056 | B1 * | 11/2005 | Classon et al. | 714/782 |
| 7,058,876 | B1 * | 6/2006 | Ireland et al. | 714/781 |
| 7,096,408 | B1 * | 8/2006 | Ireland et al. | 714/784 |

OTHER PUBLICATIONS

U.S. Appl. No. 09/976,731, filed May 29, 2003, Song.
U.S. Appl. No. 10/092,407, filed Jan. 16, 2003, Morioka et al.
U.S. Appl. No. 10/202,252, filed Jan. 29, 2004, Argon et al.
U.S. Appl. No. 10/301,769, filed Jun. 5, 2003, Jarchi et al.
Shu Lin and Daniel Costello, Jr; "Error Control Coding Fundamentals and Applications," Chapter 6: Binary BCH Codes, Pearson Prentice Hall, 2nd Ed., pp. 194-195, 224-225, 2004.
Kogo, Keiichiro; "A Simple Decoding of BCH Codes over GF(2m),"; IEEE Transactions on Communications, vol. 46, No. 6, Jun. 1998.

* cited by examiner

*Primary Examiner*—Joseph D Torres
(74) *Attorney, Agent, or Firm*—Eric Froehlich

(57) ABSTRACT

A method of correcting a communication signal with BCH product codes is disclosed. The method comprising the steps of receiving a codeword vector, establishing a generator polynomial, establishing a check polynomial, calculating a binary-matrix, and calculating the binary syndrome $S=Hr^t$. If an all zero vector results, no errors exist in the received vector. If errors exist, a tm x (N-k) binary matrix is created, the power basis expansion of $(r(\alpha^1), r(\alpha^3), r(\alpha^5), \ldots r(\alpha^{2t-1}))$ is calculated, and the syndrome is solved. The speed of the method comes from using word-level XOR's to apply the check polynomial to the stream at all offsets. The utility of this approach is due in part to the fact that the conversion matrix involved can be created quickly using only items needed elsewhere in BCH decoders: a field table and the generator polynomial coefficients.

1 Claim, 1 Drawing Sheet

METHOD OF DECODING SIGNALS HAVING BINARY BCH CODES

FIELD OF THE INVENTION

The present invention relates, in general, to error detection and correction, and, in particular to forward correction by block codes.

BACKGROUND OF THE INVENTION

When messages are transmitted over a communication network, errors in transmission may occur. To detect and correct these errors, each transmitted message is modified, adding a pre-determined error-correcting scheme to the message. After the message is received, the message must be decoded.

Common types of codes used include block codes, such as Reed-Solomon and Bose Chaudhuri Hocquenghem (BCH) codes. BCH codes are a commonly used multi-level cyclic variable length code used in error correction schemes.

The encoded message is normally grouped by codeword. A codeword is generally comprised of n symbols, further comprising k information symbols, which results in n−k redundant symbols. For BCH codes, n=$2^m$−1, and k≧n−mt. To correct for t bits, at most mt bits of redundancy are needed.

U.S. patent application Ser. No. 09/976,731, entitled "LOW COMPLEXITY AND LOW POWER FEC SUPPORTING HIGH SPEED PARALLEL DECODING OF SYNDROME-BASED FEC CODES," discloses a method of reducing power consumption and complexity when performing forward error correction by using parallel decoding techniques. The present invention is not designed to process error codes using parallel decoding techniques. U.S. patent application Ser. No. 09/976,731 is hereby incorporated by reference into the specification of the present invention.

U.S. patent application Ser. No. 10/092,407, entitled "SIGNAL PROCESSING METHOD, SIGNAL PROCESSING SYSTEM, PROGRAM FOR SIGNAL PROCESSING, AND COMPUTER-READABLE STORAGE MEDIUM ON WHICH THIS PROGRAM IS RECORDED," discloses a signal processing method for processing 40 Gbps or higher communication signals. The method calculates a Yule-Walker equation that has elements of a Galois field, and solves the equation using Jacobi's formula to obtain symmetric matrices. The number of errors is determined to be the maximum matrix size that corresponds to the non-zero solution. The method then determines if the number of errors equals the number of correctable errors. The present invention does not determine the number of errors and decide if the number of errors is correctable. U.S. patent application Ser. No. 10/092,407 is hereby incorporated by reference into the specification of the present invention.

U.S. patent application Ser. No. 10/202,252, entitled "EFFICIENT DECODING OF PRODUCT CODES," discloses a decoding system that generates test pattern syndrome and subsequent test pattern syndromes using a recursive function of the syndromes previously generated. The present invention does not generate syndromes using a recursive function of the syndromes previously generated. U.S. patent application Ser. No. 10/202,252 is hereby incorporated by reference into the specification of the present invention.

U.S. patent application Ser. No. 10/301,769, entitled "ERROR CORRECTION IMPROVEMENT FOR CONCATENATED CODES," discloses a multiple dimension codeword. Decoding is performed in multiple passes for each dimension, wherein the corrected data of the previous pass used as an input to subsequent passes. The present invention does not encode data in multiple dimensions. U.S. patent application Ser. No. 10/301,769 is hereby incorporated by reference into the specification of the present invention.

Known non-patent publications include:

Error Control Coding, Fundamentals and Applications, Chapter 6: Binary BCH Codes, Shu Lin and Daniel J. Costello, Jr., Pearson Prentice Hall, second edition, pp. 194-195, 224-225, 2004; and A Simple Decoding of BCH Codes over GF($2^m$), Keiichiro Kogo, IEEE Transactions on Communications, vol. 46, no. 6, June 1998.

SUMMARY OF THE INVENTION

It is an object of the present invention to provide a method of rapidly decoding block codes in a communication signal.

The first step of the present invention is receiving a codeword vector, the codeword vector having a BCH code with binary vectors of a user-definable length n.

The second step is establishing a generator polynomial g(x) having g($\alpha^i$)=0, for 1≦i≦2t.

The third step is establishing a check polynomial, $$h(x) = \frac{(x^n - 1)}{g(x)}.$$

The fourth step is calculating a binary-matrix.

The fifth step is calculating the binary syndrome S=H$r^t$.

In the sixth step, if the result of the fifth step is an all-zero vector, then reporting no errors exist in the received codeword vector and proceeding to the eleventh step, otherwise proceeding to the seventh step.

The seventh step is establishing a tm x (N−k) binary matrix, m rows at a time, for the odd values in 1≦i≦2t.

The eighth step is calculating the power-basis expansion of (r($\alpha^1$), r($\alpha^3$), r($\alpha^5$), . . . r($\alpha^{2t−1}$)).

The ninth step is computing the syndrome sequence using $s_{2i}$=r($\alpha^{2i}$)=r($\alpha^i$)$^2$=$s_i^2$.

The tenth step, is correcting errors in a communication signal using the calculated syndrome sequence.

The eleventh, and last, step is repeating the first step through the sixth step for each codeword vector received.

DETAILED DESCRIPTION

Figure 1:
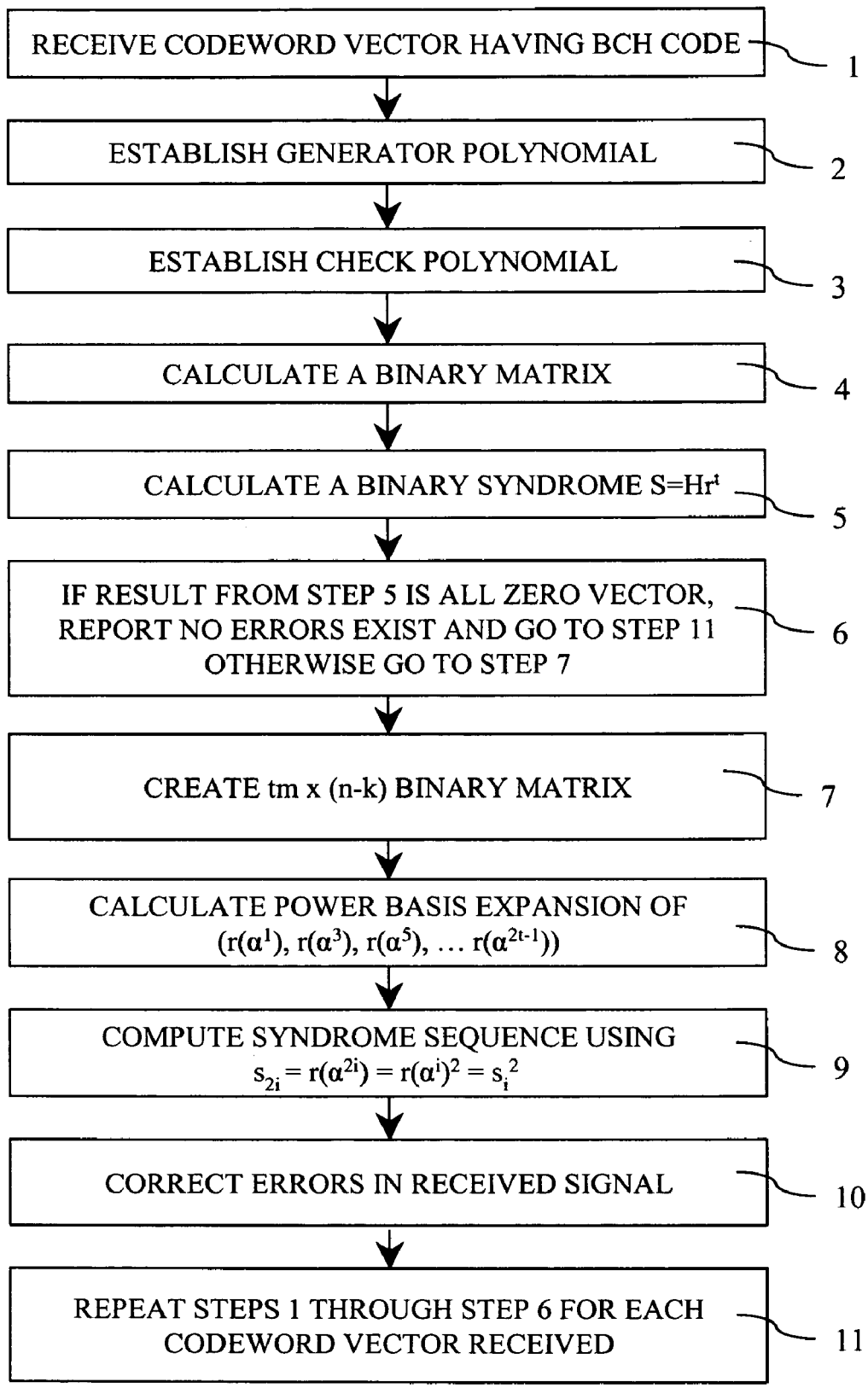
FIG. 1 is a flowchart of the steps of the present invention.

The present invention is a novel method of correcting a received communication signal by rapidly computing syndrome sequences for binary BCH codes.

An ordinary (binary) syndrome is derived from the dot products of a received vector with a binary basis for the orthogonal space. The syndrome sequence is a polynomial evaluation in a finite extension field, which is needed for the Berlekamp-Massey decoding algorithm. While a nonzero syndrome in either case only arises when an error has occurred, the syndrome sequence allows efficient calculation of the error values without the large tables that a simple syndrome decoder would require. The relevance of this connection for processing BCH codes hinges on an intrinsic software advantage from choosing the dual code basis to be consecutive cyclic shifts of the check polynomial, which is available for any cyclic code. The inherent parallelism that this affords by itself makes this strategy superior in the case that error-free blocks are common, for example, in a particular signal in which the first-stage decoding of an LDPC code handles many error patterns before BCH decoding is applied in the final stage.

The present invention speeds up the syndrome sequence calculation in many cases. An efficient binary matrix multiplication converts the syndrome just described into the syndrome sequence of the vector, with the extension field elements represented in terms of the power basis. This conversion matrix is easily derived from field multiplication and the coefficients of the generator polynomial alone. In the case of processing the signal mentioned above, which uses a 1023-long BCH code correcting up to six errors, the present invention resulted in an average savings of 40% for time to decode those blocks detected as having errors via a nonzero syndrome, compared to reprocessing those received vectors with nonzero binary syndrome.

Some background on the relevant portions of BCH codes is provided. A linear (n, k) code over a field, F, is best viewed as a k-dimensional space of n-tuples with entries in F. Given a basis for the orthogonal space, the syndrome (with respect to that basis) of an arbitrary n-tuple is then defined as the (n−k)-tuple obtained from computing the dot products with the basis elements in a fixed order. If the elements of the code, called codewords, are the domain for transmitted messages, then checking that the syndrome is zero is a quick way to test whether the arbitrary received vector is in the code. In typical cases, one also interprets a zero syndrome as most likely having resulted from no error in transmission. The confidence in concluding this is a function of the noise model (in particular supposing that a transmission with fewer errors is more likely than one with more errors), and a parameter of the code called the minimum distance. This integer, denoted by d, is simply the least number, among all pairs of distinct codewords, of entry changes needed to interchange the pair; due to linearity, d coincides with the least number of nonzero entries in any (nonzero) codeword. This value plays a role in correction in that the strategy for decoding (when a syndrome is nonzero) is to choose the codeword that can be obtained from the fewest number of changed entries, again following the general noise model. The choice of "nearest" codeword is guaranteed to be unambiguous when the number of errors is less than half of the minimum distance; this integer value is called the error-correction capacity of the code, and works out to be $[(d-1)/2]$. In fact, it is straightforward to argue that assuming the choice to be unambiguous for any $[(d-1)/2]+1$ errors violates the minimum distance being d.

A cyclic code of length n is simply a linear code that is invariant as a set under cyclic shift of the entries. In algebraic terms, it equates to a nontrivial ideal in the quotient ring $$R_n = \frac{F[x]}{(x^n - 1)}$$

The connection is that a cyclic shift of the coordinates of c(x) corresponds to the coordinates of xc(x) (mod $x^n-1$). For technical reasons, the condition gcd(|F|, n)=1 is usually imposed, so that for binary codes, the length will be odd. The ideal is principal, and g(x) is used to denote the least degree monic element, called the generator polynomial. As a vector space over F, the set of multiples in $R_n$ has dimension k equal to n−deg(g(x)), since that many consecutive "shifts" $\{x^i g(x) | 0 \leq i \leq n - \deg(g(x))-1\}$ suffice to get all multiples of g(x) in $R_n$, and because they are all needed, meaning that the corresponding shifts must be independent over F. The most common adaptation of this for error control is to regard the data as a polynomial m(x) of degree at most k−1; then the check bits appended to these coefficients are derived from (the coefficients of) the remainder $x^{n-k}m(x)$ (mod g(x)). This division is a linear operation on the coefficients of m(x), and can be synthesized as a shift register.

Simple Euclidean-algorithm arguments show that for any $c(x) \in C$, g(x) must divide c(x), and that g(x) must also divide $x^n-1$ in F[x]. It follows then that the roots of g(x)=0 must be $n^{th}$ roots of unity, and that each c(x) in the ideal "inherits" all of these roots, a fact crucial to the construction and use of BCH codes. Among various bounds that relate the minimum distance of a cyclic code to the roots of its generator polynomial, the BCH bound is perhaps of greatest practical interest, because it has a general, efficient decoding algorithm associated with it, known as the Berlekamp-Massey algorithm. At its simplest (and most commonly applied) level, the bound guarantees that the minimum distance of the cyclic code of length n over F, generated by g(x), is at least d given that: (i) gcd(|F|, n)=1, and (ii) that the roots of g(x)=0 (expressed in terms of α, a primitive root of $x^n-1=0$) include $\alpha^1, \alpha^2, \ldots, \alpha^{d-1}$. In fact, for the same conclusion to hold, the exponent string can begin at any value, and include any arithmetic progression of d−1 terms, so long as the common difference is relatively prime to n. The value, d, in the progression is often called the designed distance of the code.

In the case of F=GF(2), a BCH code of designed distance 2t+1 is chosen by selecting $$g(x) = LCM(M_1(x), M_3(x), \ldots M_{2t-1}(x))),$$

where $M_i(x)$ is the minimal polynomial of $\alpha^i$, with $\alpha \in GF(2^m)$ being a primitive root of $x^n-1=0$, and n the (odd) length of the code. The conjugate roots of the $M_i(x)$ ensure that the exponent string $\alpha^1, \alpha^2, \ldots, \alpha^{2t}$ is included among the roots of g(x)=0. The resulting code may then be used to correct up to t errors. While it is possible for this to result in a higher minimum distance than guaranteed by the BCH lower bound, decoding algorithms of the sort considered here will only handle up to t errors. Suppose now that a codeword c was transmitted, and that r=c+e was received, with e representing the errors. Since the code is binary, the error as a polynomial is $$e(x) = x^{j_1} + x^{j_2} + \ldots + x^{j_w}, \; w \leq t,$$

and the objective is to identify all of the exponents $\{j_b | 1 \leq b \leq w\}$. The initial step is the computation of the syndrome sequence, $\{s_i = r(\alpha^i) | 1 \leq i \leq 2t\}$, which is a function only of e(x), since the roots of c(x)=0 must include the roots $\{\alpha^i | 1 \leq i \leq t\}$ by choice of g(x):

$$s_i = r(\alpha^i) = c(\alpha^i) + e(\alpha^i) = e(\alpha^i), \; 1 \leq i \leq 2t.$$

For longer lengths, one commonly used shortcut for calculating the $s_i$ is to operate on the polynomial r(x), for the odd values of i in the range: first find the remainder r(x) (mod $M_i(x)$) and simply evaluate it at $\alpha^i$. The savings comes from the degree of the remainder being less than the degree of $M_i(x)$, which in turn can be far less than the code length. Moreover, finding the remainder is a linear operation, typically done with a "feed-through Galois register" based on $M_i(x)$. Then, given the odd-index values of $s_i = r(\alpha^i)$, the even-index ones may be derived from squaring, since the binary coefficients render $r(x^2) = r(x)^2$. Although it will not be needed for the present invention, the next step in traditional approaches to decoding is to determine the error-locator polynomial, defined as:

$$\sigma(z) = \prod_{b=1}^{w} (1 - \alpha^{jb} z) = 1 + \sigma_1 z + \sigma_2 z^2 + \ldots + \sigma_w z^w$$

The general case uses a linear recursive connection between the coefficients of this polynomial and the sequence $\{s_i\}$ to determine the error-locator coefficients. From there, the Chien search exhaustively tests each $\alpha^i$ to determine which is a root; each root specifies a received entry to be corrected via binary complementation. For some small values of t, it is possible to solve directly for the roots of the error locator from the syndrome sequence.

FIG. 1 is a flowchart of the steps of the present invention.

The first step 1 of the preferred embodiment is receiving a codeword vector, the codeword vector having a BCH code with binary vectors of a user-definable length n.

The second step 2 of the preferred embodiment is establishing a generator polynomial g(x) having $g(\alpha^i)=0$, for $1 \leq i \leq 2t$, where $\alpha$ is an element of a Galois field $GF(2^m)$.

The third step 3 of the present invention is establishing a check polynomial, $$h(x) = \frac{(x^n - 1)}{g(x)},$$

where $n = 2^m - 1$.

A simple way to create a basis for the dual of a cyclic (n, k) code with generator polynomial g(x) is to use cyclic shifts (of the reverse) of the so-called check polynomial $$h(x) = \frac{(x^n - 1)}{g(x)},$$

which then has degree k. This is due to the fact that gcd(|F|, n)=1 means no repeated factors in $x^n-1$; thus c(x) is a codeword if and only if $c(x)h(x) \equiv 0 \pmod{x^n-1}$, since that is equivalent to g(x) being a divisor of c(x). The coefficient of $x^j$ in that polynomial product is then:

$$\sum_{i=0}^{n-1} c_i h_{j-i},$$

where the subscripts are read modulo n, to account for the polynomial reduction modulo $x^n-1$. Each of these coefficients must be zero in F. Suppose that g(x) has degree m. Taking the case of j=n−m, this translates into saying that the coefficient vector for $h^{rev}(x)$ is orthogonal to the codeword corresponding to c(x). Moreover, each of the shifts of $h^{rev}(x)$ represents codewords orthogonal to that of c(x), since this is equivalent to shifting c(x) relative to $h^{rev}(x)$. Thus the following represent independent elements of the dual code: $\{h^{rev}(x),$ x $h^{rev}(x), \ldots, x^{m-1} h^{rev}(x)\}$. Expressed in terms of the coefficients of h(x), the dual basis is then a (n−k) x n matrix $$H = \begin{bmatrix} h_k & h_{k-1} & h_{k-2} & \ldots & h_0 & 0 & 0 & \ldots & 0 \\ 0 & h_k & h_{k-1} & \ldots & h_1 & h_0 & 0 & \ldots & 0 \\ \ldots & \ldots & \ldots & \ldots & \ldots & & & & 0 \\ 0 & 0 & \ldots & h_k & h_{k-1} & h_{k-2} & \ldots & h_0 & 0 \\ 0 & 0 & \ldots & 0 & h_k & h_{k-1} & \ldots & h_1 & h_0 \end{bmatrix}$$

where k is the dimension of the code, following the standard convention uses $(c_0, c_1, c_2, \ldots, c_{n-1})$ for the coefficients of a codeword c(x).

Thus, the fourth step 4 of the preferred embodiment is calculating a binary-matrix with respect to $$H = \begin{bmatrix} h_k & h_{k-1} & h_{k-2} & \ldots & h_0 & 0 & 0 & \ldots & 0 \\ 0 & h_k & h_{k-1} & \ldots & h_1 & h_0 & 0 & \ldots & 0 \\ \ldots & \ldots & \ldots & \ldots & \ldots & & & & 0 \\ 0 & 0 & \ldots & h_k & h_{k-1} & h_{k-2} & \ldots & h_0 & 0 \\ 0 & 0 & \ldots & 0 & h_k & h_{k-1} & \ldots & h_1 & h_0 \end{bmatrix},$$

the binary-matrix syndrome calculated by performing an exclusive-OR function on (n−k)-long segments of the coefficients of the binary vector with the coefficients of the polynomial established in step (3), where k is the dimension of the received binary vector.

Computing a syndrome with respect to this matrix offers advantages in software computation. One advantage derives from the fact that a received vector can be shifted according to the terms in $h^{rev}(x)$. The time spent is faster than finding n−k generic vector dot products would be. To illustrate this, consider the case of n=15, $$g(x) = x^8 + x^7 + x^6 + x^4 + 1,$$

which gives a (15, 7, 5) BCH code. Then $h(x) = x^7 + x^6 + x^4 + 1$, and the top row of H is (1 1 0 1 0 0 0 1 0 0 0 0 0 0 0). Given a received vector $(r_0, r_1, r_2, \ldots, r_{14})$, applying H equates to vector addition of the following 8-tuples, representing shifts of $(r_0, r_1, r_2, \ldots, r_{14})$,:

$$\begin{bmatrix} r_0 & r_1 & r_2 & r_3 & r_4 & r_5 & r_6 & r_7 \\ r_1 & r_2 & r_3 & r_4 & r_5 & r_6 & r_7 & r_8 \\ r_3 & r_4 & r_5 & r_6 & r_7 & r_8 & r_9 & r_{10} \\ r_7 & r_8 & r_9 & r_{10} & r_{11} & r_{12} & r_{13} & r_{14} \end{bmatrix}$$

The leftmost column sum equates to the dot product of the first row of H with $(r_0, r_1, r_2, \ldots, r_{14})$; the next sum equates to the dot product with the second row, and so on. The computational difference in software is that the sums in the eight dot products occur together, since the entries listed above in each shift fit into single words. For longer lengths, the work is split among several words, but the advantage remains. The choice of computing syndromes with respect to a matrix formed from the shifts of $h^{rev}(x)$ thus provides a unique advantage in software.

In contrast, one could also compute a codeword check, but using elements of $GF(2^m)$ $$\begin{bmatrix} 1 & \alpha & \alpha^2 & \ldots & \alpha^{n-1} \\ 1 & \alpha^3 & \alpha^6 & \ldots & \alpha^{3(n-1)} \\ \ldots & \ldots & \ldots & \ldots & \ldots \\ 1 & \alpha^{2t-1} & \alpha^{2(2t-1)} & \ldots & \alpha^{(2t-1)(n-1)} \end{bmatrix}$$

Applying this to a received vector, r, equates to interpreting the received codeword as a polynomial, or computing the odd values $r(\alpha^i)$ in the syndrome sequence. As mentioned above, having the odd terms of the syndrome sequence be zero suffices to ensure that all of $\{\alpha^i | 1 \leq i \leq 2t\}$ are included among the roots of $r(x)=0$. This means that each minimal polynomial $M_i(x)$ in that range is a divisor of $r(x)$, and hence that $g(x)$ divides $r(x)$.

The following observation records formally a connection between this check over $GF(2^m)$ and the syndrome with respect to H (as formed from the shifts of $h^{rev}(x)$.)

The fifth step 5 of the preferred embodiment is calculating the binary syndrome $S=Hr^t$, the binary syndrome calculated by matrix-multiplying the received codeword vector by the binary-matrix calculated in step (4).

In the sixth step 6 of the preferred embodiment, if the result of fifth step 5 is an all-zero vector, then reporting no errors exist in the received codeword vector and proceeding to the eleventh step 11, otherwise proceeding to the seventh step 7.

The seventh step 7 of the preferred embodiment is establishing a tm x (n−k) binary matrix, m rows at a time, for the odd values in $1 \leq i \leq 2t$.

By deriving a tm x (n−k) binary matrix that converts the (n−k)-tuple binary syndrome calculated in the fifth step 5 directly into the power basis expressions for $r(\alpha^1)$, $r(\alpha^3)$, $r(\alpha^5)$, ..., and $r(\alpha^{2t-1})$, the full syndrome sequence may be derived. Beyond the simplicity of the exposition, the derivation will yield a simple algorithm to construct a conversion matrix without any linear-algebra overhead. In fact, the ingredients needed are all items required for the Berlekamp-Massey decoding algorithm anyway; this adds to the overall utility of the approach, in that the converter can be generated as part of the decoder routine, if necessary.

The eighth step 8 of the preferred embodiment is calculating the power-basis expansion of $(r(\alpha^1), r(\alpha^3), r(\alpha^5), \ldots r(\alpha^{2t-1}))$, the power basis expansion calculated by applying the binary matrix established in the seventh step 7 to the binary syndrome calculated in the fifth step 5.

The ninth step 9 of the preferred embodiment is computing the syndrome sequence using $s_{2i}=r(\alpha^{2i})=r(\alpha^i)^2=s_i^2$.

The tenth step 10 is correcting errors in a communication signal using the calculated syndrome sequence.

The eleventh, and last, step 11 of the preferred embodiment is repeating the first step 1 through the sixth step 6 for each codeword vector received.

As noted above, the received communication signal may have errors that were introduced during transmission. Blocks without errors are skipped, but blocks with errors are corrected using the method described above.

The following mathematical theorems demonstrate the correctness of the method described above. Although the proof will be for a more general case, it is stated for a limited range to make the subscript notation convenient.

Lemma: Suppose $x^n-1=g(x)h(x)$ in $GF(2)[X]$, with $k$ = degree(h(x))$\geq$degree(g(x))−1. Then the following binary matrix identity involving the coefficients of $g(x)$ and $h(x)$ holds:

$$\begin{bmatrix} g_{n-k} & g_{n-k-1} & g_{n-k-2} & \ldots & g_1 \\ 0 & g_{n-k} & g_{n-k-1} & \ldots & g_2 \\ 0 & 0 & \ldots & \ldots & \ldots \\ 0 & 0 & \ldots & \ldots & g_{n-k-1} \\ 0 & 0 & \ldots & 0 & g_{n-k} \end{bmatrix} \begin{bmatrix} h_k & h_{k-1} & h_{k-2} & \ldots & h_{2k-n+1} \\ 0 & h_k & h_{k-1} & \ldots & h_{2k-n} \\ 0 & 0 & \ldots & \ldots & \ldots \\ 0 & 0 & \ldots & h_k & h_{k-1} \\ 0 & 0 & \ldots & 0 & h_k \end{bmatrix} = I_{n-k}$$

Proof: Recall first from the description above that all cyclic shifts of the two n-long binary vectors $(h_k, h_{k-1}, h_{k-2}, \ldots, h_0, 0, 0, \ldots, 0)$ and $(g_0, g_1, g_2, \ldots, g_{n-k}, 0, 0, \ldots, 0)$ must have dot product of zero in $GF(2)$. One such dot product will have entries aligned as follows:

$$\begin{array}{cccccccc} h_k & h_{k-1} & h_{k-1} & \ldots & h_0 & 0 & 0 & \ldots & 0 \\ g_{n-k} & 0 & 0 & \ldots & g_0 & g_1 & g_2 & \ldots & g_{n-k-1} \end{array}$$

From $x^n-1=g(x)h(x)$, it follows that $1=h_0=g_0=h_k=g_{n-k}$. All of the dot products involved in the matrix identity derive from: (1) setting $g_0=0$ (since it does not appear in the matrix) and (2) the pairing shown, or one involving the first n−k−1 right cyclic shifts of the second row. Initially, the $g_0$-position (reset to 0) is paired with a 1 in the top row, so that the resulting dot product will be 1. For the remaining n−k−1 shifts, the $g_0$-position will be paired with one of the n−k−1 0's to the right of the $h_0$ entry; thus the off-diagonal of the product is all zero. The diagonal entries are all simply $h_k g_{n-k}=1$. End of proof.

The relevance of this is that the matrix formed from the h(x)-coefficients is just the first n−k columns of the matrix H. The proof shows that this result holds without the assumption degree(h(x))$\geq$degree(g(x))−1, although as stated this covers virtually all cases of interest.

Next form a t x (n−k) matrix over $GF(2^m)$ as the following product L notated by $A M_g$=

$$\begin{bmatrix} 1 & \alpha & \alpha^2 & \ldots & \alpha^{n-k-1} \\ 1 & \alpha^3 & \alpha^6 & \ldots & \alpha^{3(n-k-1)} \\ \ldots & \ldots & \ldots & \ldots & \ldots \\ 1 & \alpha^{2t-1} & \alpha^{2(2t-1)} & \ldots & \alpha^{(2t-1)(n-k-1)} \end{bmatrix} \begin{bmatrix} g_{n-k} & g_{n-k-1} & g_{n-k-2} & \ldots & g_1 \\ 0 & g_{n-k} & g_{n-k-1} & \ldots & g_2 \\ 0 & 0 & \ldots & \ldots & \ldots \\ 0 & 0 & \ldots & \ldots & g_{n-k-1} \\ 0 & 0 & \ldots & 0 & g_{n-k} \end{bmatrix}$$

Then with H formed as before from shifts of $h^{rev}(x)$, it follows that applying any of $r(x)=x^i$, with $0 \leq i \leq n-k-1$, will result in $LHr^t=(\alpha^i, \alpha^{3i}, \ldots, \alpha^{i(2t-1)})=(r(\alpha^1), r(\alpha^3), \ldots, r(\alpha^{2t-1}))$. In fact, this sample is sufficient to show that L will function as a general conversion matrix for any $r(x)$, as will be shown below. To process the binary syndromes without using field arithmetic, it remains only to replace the $\alpha^i$ entries in the expression above with the respective power-basis coefficients, thus creating a binary tm x (n−k) conversion matrix.

Let $\alpha \in GF(2^m)$ be a primitive root of $x^n-1=0$. Suppose $x^n-1=g(x)h(x)$ in $GF(2)[x]$, with $k=\text{degree}(h(x))$, and $g(\alpha^i)=0$, for $1 \leq i \leq 2t$. Let H be the $(n-k) \times n$ matrix formed from the first n–k shifts of the n-long vector for $h^{rev}(x)$: $(h_k, h_{k-1}, h_{k-2}, \ldots, h_0, 0, 0, \ldots, 0)$. Then there is a binary tm x(n–k) matrix L such that for all binary n-tuples, $r=(r_0, r_1, r_2, \ldots, r_n)$, the identity $L[Hr^t]=(r(\alpha^1), r(\alpha^3), r(\alpha^5), \ldots, r(\alpha^{2t-1}))$ holds, where $$r(\alpha^i) = \sum_{j=0}^{n-1} r_j \alpha^{ij}.$$

Moreover, L is derivable from (1) multiplication by $\alpha^i$ (for odd i up to 2t–1), and (2) the coefficients of g(x) alone.

To prove this, by linearity it is sufficient to show the result for $r(x)=x^i$, with $0 \leq i \leq n-1$. Let L be defined as above. Due to the matrix identity described above, the first n–k columns of LH are just $$\begin{bmatrix} 1 & \alpha & \alpha^2 & \ldots & \alpha^{n-k-1} \\ 1 & \alpha^3 & \alpha^6 & \ldots & \alpha^{3(n-k-1)} \\ \ldots & \ldots & \ldots & \ldots & \ldots \\ 1 & \alpha^{2t-1} & \alpha^{2(2t-1)} & \ldots & \alpha^{(2t-1)(n-k-1)} \end{bmatrix},$$

so that the claim holds for $r(x)=x^i$, with $0 \leq i \leq n-k-1$. In fact $\{Hr^t | r(x)=x^i, 0 \leq i \leq n-k-1\}$ forms a basis for the range of the map $r \to Hr^t$; this follows from the fact that the leftmost n–k columns constitute an upper-triangular matrix. Consequently, for $n-k \leq i \leq n-1$, any $x^i$ must differ by a codeword, c(x), from a sum of terms in $$\left\{x^j | 0 \leq j \leq n-k-1\right\}: \sum_{j=0}^{n-k-1} a_j x^j.$$

For the range $1 \leq f \leq 2t$, it then follows that $$r(\alpha^f) = c(\alpha^f) + \sum_{j=0}^{n-k-1} a_j x^{fj} = \sum_{j=0}^{n-k-1} a_j x^{fj}.$$

But r and $(a_0, a_1, \ldots, a_{n-k-1}, 0, 0, \ldots, 0)$ must have the same syndrome with respect to H. Thus, applying LH to the vector corresponding to $r(x)=x^i$ is the same as applying it to $(a_0, a_1, \ldots, a_{n-k-1}, 0, 0, \ldots, 0)$. By linearity, the latter yields $(a(\alpha^1), a(\alpha^3), \ldots, a(\alpha^{2t-1}))=(r(\alpha^1), r(\alpha^3), \ldots, r(\alpha^{2t-1}))$, which completes the argument. Finally, note that the binary representation of L as a tm x (n–k) matrix may be derived a row of m-tuples at a time, starting at the left with $g_{n-k}=\alpha^0 \Leftrightarrow (1, 0, 0, \ldots, 0)^t$, followed by the m-tuple for $\beta=\alpha^0 \alpha^i + g_{n-k-1}\alpha^0$, then $\beta \alpha^i + g_{n-k-2}\alpha^0$, and so on.

It can also be shown that the rightmost m-tuple in the $i^{th}$ "row" of L, corresponds to $\alpha^{-i}$.

The rightmost entry is $\beta = g_1 + g_2 \alpha^i + g_3 \alpha^{2i} + \ldots + g_{n-k}\alpha^{n-k-1}$. Observe that $\alpha^i \beta = g(\alpha^i) - g_0 = 0 - g_0 = 1$. Thus $\beta = \alpha^{-i}$.

The construction of L is a recursive calculation in $GF(2^m)$: for each odd value with $1 \leq i \leq 2t$, the derivation may be regarded as a step-by-step "Horner's rule" evaluation of $g^{rev}(x)$ at $\alpha^i$. The leftmost is $g_{n-k}=1$, which is followed by $g_{n-k}\alpha^i + g_{n-k-1}$, then $\alpha^i(g_{n-k}\alpha^i + g_{n-k-1}) + g_{n-k-1}$, and so on. The final value would be $g(\alpha^i)=0$, but that is discarded, yielding n–k nonzero columns.

The result applies to narrow-sense BCH codes, meaning that the exponent sequence guaranteeing minimum weight 2t+1 starts with $\alpha^1$. The main adjustment needed to change from narrow-sense BCH codes is to expand the $GF(2^m)$-matrix A in the product to include as many as 2t rows (associated with the BCH-bound exponent sequence), since reliance on the fact that $r(x^2)=r(x)^2$ to fill in even-index cases may not always be possible.

Returning to the (15, 7, 5) BCH code with $g(x)=x^8+x^7+x^6+x^4+1$, the field is based on $\alpha^4+\alpha+1=0$. From this alone, the columns of L can be generated recursively:

$$L = \begin{bmatrix} 1 & 1 & 1 & 0 & 0 & 1 & 1 & 1 \\ 0 & 1 & 1 & 1 & 1 & 1 & 0 & 0 \\ 0 & 0 & 1 & 1 & 1 & 1 & 1 & 0 \\ 0 & 0 & 0 & 1 & 1 & 1 & 1 & 1 \\ 1 & 1 & 1 & 0 & 0 & 0 & 0 & 1 \\ 0 & 0 & 0 & 1 & 0 & 0 & 1 & 1 \\ 0 & 0 & 1 & 1 & 0 & 1 & 0 & 1 \\ 0 & 1 & 0 & 1 & 1 & 1 & 1 & 1 \end{bmatrix}.$$

Given a received vector, say r=(0,1,0,1,0,1,1,0,0,0,0,1,0,0,1), the syndrome with respect to $h^{rev}(x)=1+x+x^3+x^7$ is just the vector sum of the entries from the shifted versions of r:

```
0 1 0 1 0 1 1 0
1 0 1 0 1 1 0 0
1 0 1 1 0 0 0 0
0 0 0 0 1 0 0 1
``` to obtain $Hr^t=(0\ 1\ 0\ 0\ 0\ 0\ 1\ 1)$. Applying L to $(0\ 1\ 0\ 0\ 0\ 0\ 1\ 1)^t$ yields $(1\ 1\ 1\ 0\ 0\ 0\ 1\ 1)$, indicating that $r(\alpha^1)=1+\alpha+\alpha^2$ and $r(\alpha^3)=\alpha^2+\alpha^3$. It is noted that storing the columns of L as rows allows a further advantage from the principle used to compute $Hr^t$ in software. Reworking this with a textbook approach involves first reducing $r(x)=x+x^3+x^5+x^6+x^{11}+x^{14}$ modulo the two irreducible factors of g(x), namely $1+x+x^4$ and $1+x+x+x^2+x^3+x^4$ to obtain the remainders $1+x+x^2$ and $x^2$. The first of these is evaluated at $\alpha^1$, and the second at $\alpha^3$, which gives $r(\alpha^1)=1+\alpha+\alpha^2$ and $r(\alpha^3)=\alpha^6=\alpha^2+\alpha^3$, as before. Had $Hr^t$ worked out to be zero, the processing for this block would cease, saving unnecessary work on the syndrome sequence.

The goal of the present invention is speed the processing of a signal of the type mentioned. When a BCH code is concatenated with an LDPC code, the initial decoding of the LDPC portion makes error free BCH code blocks more common than usual. Thus the strategy of adopting a fast binary syndrome calculation in order to identify which blocks required decoding was advantageous. Prior to the present invention work, given a nonzero syndrome, the codewords had been reprocessed to find the syndrome sequence. Replacing that step with a matrix multiplication applied to the binary syndrome reduces the overall processing time for the BCH code portion by up to 40%. Moreover the algorithm to create the conversion matrix (which of course varies from code to code) is simple enough to be done quickly as part of the processing.

The present invention's approach to decoding error codes in a received communication signal and how the syndrome sequence is calculated proves superior in software. As a first consideration, it should be noted that the motivation for computing the syndrome sequence (as presented in most textbooks) by the remainders $r(x)$ (mod $M_i(x)$), for each irreducible factor $M_i(x)$ of $g(x)$ is linked to hardware implementation; that context allows these to be done in parallel. A more direct comparison for software would be as follows: find the remainder $b(x) \equiv r(x)$ (mod $g(x)$), producing an (n–k)-bit syndrome in the process; again a tm x (n–k) matrix C could be created from the binary projection of the matrix shown.

$$\begin{bmatrix} 1 & \alpha & \alpha^2 & \ldots & \alpha^{n-k-1} \\ 1 & \alpha^3 & \alpha^6 & \ldots & \alpha^{3(n-k-1)} \\ \ldots & \ldots & \ldots & \ldots & \ldots \\ 1 & \alpha^{2t-1} & \alpha^{2(2t-1)} & \ldots & \alpha^{(2t-1)(n-k-1)} \end{bmatrix},$$

This will then convert the coefficients of $b(x)$ into $(r(\alpha^1), r(\alpha^3), r(\alpha^5), \ldots, r(\alpha^{2t-1}))$, again expressed in terms of the power basis. With this approach, the speed comparison then reduces to polynomial reduction modulo $g(x)$ versus the word-level computation of the check equation dot products.

Even with this directness, it is not possible to state which approach is preferable in a given situation, since it will be a function of the computer architecture. It's efficiency will depend primarily on the number of bits per word, and the time to access (n–k)-long segments of the received vector to exclusive-or to compute $Hr^t$. Persons skilled in the art will recognize that a standard way to accelerate the step of computing the polynomial remainder $r(x)$ (mod $g(x)$) is to process the coefficients in segments: store a table that holds the cumulative effect from the feedback and stepping. In polynomial terms, this is illustrated by the following example: $r_0 + r_1 x + r_2 x^2 + \ldots + r_{15} x^{15}$ can be reduced modulo $g(x)$ eight bits at a time via a table which simply pairs the coefficients $(r_8, r_9, r_{10}, \ldots, r_{15})$ with $(b_0, b_1, b_2, \ldots, b_7)$, where the relation $r_8 x^8 + r_9 x^9 + \ldots + r_{15} x^{15} \equiv b_0 + b_1 x + b_2 x^2 + \ldots + b_7 x^7$ (mod $g(x)$) holds; thus the net result of the overall step is $(b_0 + r_0) + (b_1 + r_1)x + (b_2 + r_2)x^2 + \ldots + (b_7 + r_7)x^7$.

While the preferred embodiments of the invention have been illustrated and described, it will be apparent to those of ordinary skill in the art that various changes and modifications may be made without deviating from the inventive concepts set forth above.

What is claimed is:

1. A method of processing a signal, comprising the steps of:
   a) receiving a codeword vector, the codework vector having a BCH code with binary vectors of a user-definable length n;
   b) establishing a generator polynomial $g(x)$ having $g(\alpha^i) = 0$, for $1 \leq i \leq 2t$, where $\alpha$ is an element of a Galois field $GF(2^m)$;
   c) establishing a check polynomial, $$h(x) = \frac{(x^n - 1)}{g(x)},$$

where $n = 2^m - 1$;
   d) calculating a binary-matrix with respect to $$H = \begin{bmatrix} h_k & h_{k-1} & h_{k-2} & \ldots & h_0 & 0 & 0 & \ldots & 0 \\ 0 & h_k & h_{k-1} & \ldots & h_1 & h_0 & 0 & \ldots & 0 \\ \ldots & \ldots & \ldots & \ldots & \ldots & & & \ldots & 0 \\ 0 & 0 & \ldots & h_k & h_{k-1} & h_{k-2} & \ldots & h_0 & 0 \\ 0 & 0 & \ldots & 0 & h_k & h_{k-1} & \ldots & h_1 & h_0 \end{bmatrix},$$

the binary-matrix syndrome calculated by performing an exclusive-OR function on (n–k)-long segments of the coefficients of the binary vector with the coefficients of the polynomial established in step (c), where k is the dimension of the received binary vector;
   e) calculating the binary syndrome $S = Hr^t$, the binary syndrome calculated by matrix-multiplying the received codework vector by the binary-matrix calculated in step (d);
   f) if the result of step (e) is an all-zero vector, then reporting no errors exist in the received codeword vector and proceeding to step (k), otherwise proceeding to step (g);
   g) establishing a tm x (N–k) binary matrix, m rows at a time, for the odd values in $1 \leq i \leq 2t$;
   h) calculating the power-basis expansion of $(r(\alpha^1), r(\alpha^3), r(\alpha^5), \ldots r(\alpha^{2t-1}))$, the power basis expansion calculated by applying the binary matrix established in step (g) to the binary syndrome calculated in step (e);
   i) solving the syndrome sequence using $s_{2i} = r(\alpha^{2i}) = r(\alpha^i)^2 = s_i^2$;
   j) correcting errors in a communication signal using the calculated syndrome sequence; and
   k) repeating step (a) through step (f) for each codeword vector received.

* * * * *